United States Patent [19]

Hoffman et al.

[11] Patent Number: 5,496,778
[45] Date of Patent: Mar. 5, 1996

[54] POINT-OF-USE AMMONIA PURIFICATION FOR ELECTRONIC COMPONENT MANUFACTURE

[75] Inventors: Joe G. Hoffman, Cardiff-by-the-Sea; R. Scot Clark, Fallbrook, both of Calif.

[73] Assignee: Startec Ventures, Inc., Fallbrook, Calif.

[21] Appl. No.: 179,001

[22] Filed: Jan. 7, 1994

[51] Int. Cl.⁶ .................................................... C01C 1/00
[52] U.S. Cl. ...................... 437/250; 29/25.01; 55/220; 95/273; 95/285; 203/DIG. 16; 423/352; 437/225
[58] Field of Search ........................... 423/352; 29/25.01; 95/273, 285; 55/220; 437/225, 250; 203/DIG. 16

[56] References Cited

U.S. PATENT DOCUMENTS

| | | | |
|---|---|---|---|
| 3,679,549 | 7/1972 | Newman et al. | 423/352 |
| 3,745,748 | 7/1973 | Goldfield et al. | 95/273 |
| 4,075,306 | 2/1978 | Muromura | 423/352 |
| 4,828,660 | 5/1989 | Clark et al. | 204/82 |
| 5,242,468 | 9/1993 | Clark et al. | 29/25.01 |

FOREIGN PATENT DOCUMENTS

| | | | |
|---|---|---|---|
| 176420 | 7/1989 | Japan | 95/273 |
| 830188 | 3/1962 | United Kingdom | 95/273 |

*Primary Examiner*—Wayne Langel
*Attorney, Agent, or Firm*—Townsend and Townsend and Crew

[57] ABSTRACT

Highly purified ammonia for use in processes for the production of high-precision electronic components is prepared on-site by drawing ammonia vapor from a liquid ammonia reservoir, passing the vapor through a filter capable of filtering out particles of less than 0.005 micron in size, and scrubbing the filtered vapor in a high-pH aqueous scrubber.

19 Claims, 2 Drawing Sheets

5,496,778

POINT-OF-USE AMMONIA PURIFICATION FOR ELECTRONIC COMPONENT MANUFACTURE

This invention lies in the field of the manufacture of high-precision electronic components, and relates to the preparation and handling of the ammonia used as a treatment agent in the manufacture of such components.

BACKGROUND OF THE INVENTION

A major concern at every stage in the manufacture of electronic components is contamination. Control of contamination is critical to product quality, and an extremely high level of cleanliness and purity in the manufacturing environment is needed for obtaining acceptable product yield and maintaining profitability. These requirements are particularly acute in the manufacture of very high density circuitry as well as in ultra-precision bearings, recording heads and LCD displays.

Sources of contamination include the manufacturing facility, personnel and processing equipment. In many cases, contamination can be lowered to acceptable levels by the use of "clean room" techniques such as isolation, air filtration, special equipment and special clothing and body coverings to avoid contact between the operator and the manufacturing materials. With ultra-high precision manufacturing, however, the highest levels at which defects can be tolerated are particularly low and control over sources of contamination is even more critical.

Ammonia presents particular difficulties, since liquid ammonia contains both solid and volatile impurities, many of which are damaging to electronic components if present during the manufacturing process. The impurities level and content may vary widely depending on the source as well as the handling method, and all such impurities must be removed before the ammonia can be used in electronic component production lines.

To meet this standard, production facilities have had to obtain high-quality ammonia at considerable cost from the limited sources which are able to supply ammonia at an acceptable grade. Only qualified suppliers can be used, and new suppliers must be qualified before their product can be accepted. This cost and the lack of flexibility add considerably to the cost of the components.

Further difficulties arise in meeting Department of Transportation regulations. Ammonium hydroxide are shipped at concentrations no higher than 30%.

Clearly there is a need for a reliable means of supplying ammonia at a purity level which will produce a high yield of acceptable product in ultra-high precision components, and which can meet the requirements of advancing electronics technology.

SUMMARY OF THE INVENTION

It has now been discovered that ammonia can be supplied to a production line for high-precision electronic devices in ultra-high purity form by use of an on-site system which draws ammonia vapor from a liquid ammonia reservoir, passes the ammonia vapor through a microfiltration filter, and scrubs the filtered vapor with high-pH purified water. The uniqueness of this discovery is that it can convert commercial grade ammonia to ammonia of sufficiently high purity for high-precision manufacturing without the need for conventional column distillation. The drawing of the ammonia vapor from the supply reservoir serves by itself as a single-stage distillation, eliminating non-volatiles or high-boiling impurities, such as alkali and alkaline earth metal oxides, carbonates and hydrides, transition metal halides and hydrides, and high-boiling hydrocarbons and halocarbons. The reactive volatile impurities that could be found in commercial grade ammonia, such as certain transition metal halides, Group III metal hydrides and halides, certain Group IV hydrides and halides, and halogens, previously thought to require distillation for removal, are now discovered to be capable of removal by scrubbing to a degree which is adequate for high-precision operations. This is a highly unusual discovery, since scrubber technology is traditionally used for the removal of macro-scale, rather than micro-scale, impurities. In the present invention, the scrubber lowers the levels of impurities which are damaging to semiconductor wafer manufacture to less than 1 ppb per element or less than 30 ppb total. For operations where even greater purity is desired, distillation may also be performed subsequent to the scrubbing. An advantage of the invention, however, is that if distillation is included, the scrubber considerably lessens the burden on, and design requirements for, the distillation column, enhancing the product purity even further. The removal of impurities which are close-boiling relative to ammonia, such as reactive hydrides, fluorides and chlorides, simplifies the distillation column design considerably. While this system and process are applicable to ammonia utilization sites at high-precision production lines in general, the invention is of particular interest for the purification of ammonia used at semiconductor wafer cleaning stations.

These and other features, embodiments, applications and advantages of the invention will be apparent from the description which follows.

DETAILED DESCRIPTION OF THE INVENTION AND PREFERRED EMBODIMENTS

Figure 1:
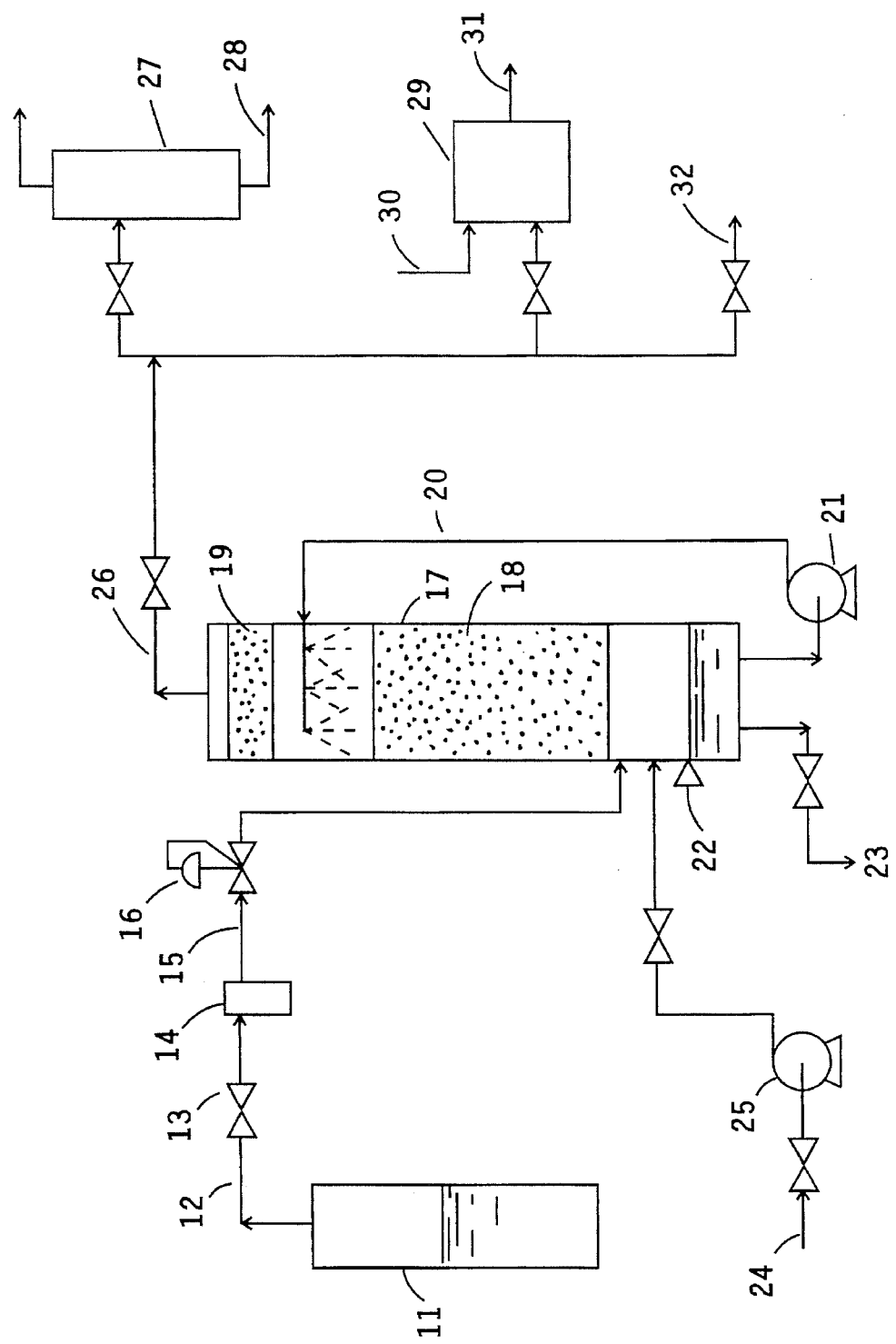
FIG. 1 is an engineering flow diagram of one example of a unit for the production of ultrapure ammonia in accordance with the present invention.

In accordance with this invention, ammonia vapor is first drawn from the vapor space in a liquid ammonia supply reservoir. Drawing vapor in this manner serves as a single-stage distillation, leaving certain solid and high-boiling impurities behind in the liquid phase. The supply reservoir can be any conventional supply tank or other reservoir suitable for containing ammonia, and the ammonia can be in anhydrous form or an aqueous solution. The reservoir can be maintained at atmospheric pressure or at a pressure above atmospheric if desired to enhance the flow of the ammonia through the system. The reservoir is preferably heat controlled, so that the temperature is within the range of from about 10° C. to about 50° C., preferably from about 15° C. to about 35° C., and most preferably from about 20° C. to about 25° C.

Impurities that will be removed as a result of drawing the ammonia from the vapor phase include metals of Groups I and II of the Periodic Table, as well as aminated forms of these metals which form as a result of the contact with ammonia. Also included will be oxides and carbonates of these metals, as well as hydrides such as beryllium hydride and magnesium hydride. Further included will be Group III elements and their oxides, as well as ammonium adducts of hydrides and halides of these elements. Still further are transition metal hydrides. Heavy hydrocarbons and halocarbons such as pump oil will aim be included.

The ammonia drawn from the reservoir is passed through a filtration unit to remove any solid matter entrained with the vapor. Microfiltration and ultrafiltration units and membranes are commercially available and can be used. The grade and type of filter will be selected according to need. Preferred filters are those which eliminate particles of 0.005 micron or greater in size, and further preferred are those which filter down to 0.003 micron particle size.

The filtered vapor is then passed to a scrubber in which the vapor is scrubbed with high-pH purified (preferably deionized) water. The high-pH water is preferably an aqueous ammonia solution, the concentration raised to saturation by recycling through the scrubber. The scrubber may be conveniently operated as a conventional scrubbing column in countercurrent fashion. Although the operating temperature is not critical, the column is preferably run at a temperature ranging from about 10° C. to about 50° C., preferably from about 15° C. to about 35° C. Likewise, the operating pressure is not critical, although preferred operation will be at a pressure of from about atmospheric pressure to about 30 psi above atmospheric. The column will typically contain a conventional column packing to provide for a high degree of contact between liquid and gas, and preferably a mist removal section as well.

In one presently preferred example, the column has a packed height of approximately 3 feet (0.9 meter) and an internal diameter of approximately 7 inches (18 era), to achieve a packing volume of 0.84 cubic feet (24 liters), and is operated at a pressure drop of about 0.3 inches of water (0.075 kPa) and less than 10% flood, with a recirculation flow of about 2.5 gallons per minute (0.16 liter per second) nominal or 5 gallons per minute (0.32 liter per second) at 20% flood, with the gas inlet below the packing, and the liquid inlet above the packing but below the mist removal section. Preferred packing materials for a column of this description are those which have a nominal dimension of less than one-eighth of the column diameter. The mist removal section of the column will have a more dense packing, and is otherwise conventional in construction. It should be understood that all descriptions and dimensions in this paragraph are examples only. Each of the system parameters may be varied.

In typical operation, startup is achieved by first saturating deionized water with ammonia to form a solution for use as the starting scrubbing medium. During operation of the scrubber, a small amount of liquid in the column sump is drained periodically to remove accumulated impurities.

Examples of impurities that will be removed by the scrubber include reactive volatiles such as silane ($SiH_4$) and arsine ($AsH_3$), halides and hydrides of phosphorus, arsenic and antimony, transition metal halides in general, and Group III and Group VI metal halides and hydrides.

The units described up to this point may be operated in either batchwise, continuous or semi-continuous manner. Continuous or semi-continuous operation is preferred. The volumetric processing rate of the ammonia purification system is not critical and may vary widely. In most operations for which the present invention is contemplated for use, however, the flow rate of ammonia through the system will be within the range of about 200 cc/h to about 2 L/h.

Ammonia leaving the scrubber can be further purified by distillation prior to use, depending on the particular type of manufacturing process for which the ammonia is being purified. When the ammonia is intended for use in chemical vapor deposition, for example, the inclusion of a dehydration unit and a distillation unit in the system will be beneficial. The distillation column may also be operated in either batchwise, continuous or semi-continuous manner. In a batch operation, a typical operating pressure might be 300 pounds per square inch absolute (2,068 kPa), with a batch size of 100 pounds (45.4 kg). The column in this example has a diameter of 8 inches (20 cm), a height of 72 inches (183 cm), operating at 30% of flood, with a vapor velocity of 0.00221 feet per second (0.00067 meter per second), a height equivalent to a theoretical plate of 1.5 inches (3.8 era), and 48 equivalent plates. The boiler size in this example is about 18 inches (45.7 cm) in diameter and 27 inches (68.6 cm) in length, with a reflux ratio of 0.5, and recirculating chilled water enters at 60° F. (15.6° C.) and leaves at 90° F. (32.2° C.). Again, this is merely an example; distillation columns varying widely in construction and operational parameters can be used.

Depending on its use, the purified ammonia, either with or without the distillation step, may be used as a purified gas or as an aqueous solution, in which case the purified ammonia is dissolved in purified (preferably deionized) water. The proportions and the means of mixing are conventional.

A flow chart depicting one example of an ammonia purification unit in accordance with this invention is shown in FIG. 1. Liquid ammonia is stored in a reservoir 11. Ammonia vapor 12 is drawn from the vapor space in the reservoir, is then passed through a shutoff valve 13, then through a filter 14. The filtered ammonia vapor 15, whose flow is controlled by a pressure regulator 16, is then directed to a scrubbing column 17 which contains a packed section 18 and a mist removal pad 19. Saturated aqueous ammonia 20 flows downward as the ammonia vapor flows upward, the liquid being circulated by a circulation pump 21, and the liquid level controlled by a level sensor 22. Waste 23 is drawn off periodically from the retained liquid in the bottom of the scrubber. Deionized water 24 is supplied to the scrubber 17, with elevated pressure maintained by a pump 25. The scrubbed ammonia 26 is directed to one of three alternate routes. These are:

(1) A distillation column 27 where the ammonia is purified further. The resulting distilled ammonia 28 is then directed to the point of use.

(2) A dissolving unit 29 where the ammonia is combined with deionized water 30 to form an aqueous solution 31, which is directed to the point of use.

(3) A transfer line 32 which carries the ammonia in gaseous form to the point of use.

The second and third of these alternatives, which do not utilize the distillation column 27, are suitable for producing ammonia with less than 100 parts per trillion of any metallic impurity. For certain uses, however, the inclusion of the distillation column 27 is preferred. Examples are furnace or chemical vapor deposition (CVD) uses of the ammonia. If the ammonia is used for CVD, for example, the distillation column would remove non-condensables such as oxygen and nitrogen, that might interfere with CVD. In addition, since the ammonia leaving the scrubber 17 is saturated with water, a dehydration unit may be incorporated into the system between the scrubber 17 and the distillation column 27, as an option, depending on the characteristics and efficiency of the distillation column.

With any of these alternatives, the resulting stream, be it gaseous ammonia or an aqueous solution, may be divided into two or more branch streams, each directed to a different use station, the purification unit thereby supplying purified ammonia to a number of use stations simultaneously.

Figure 2:
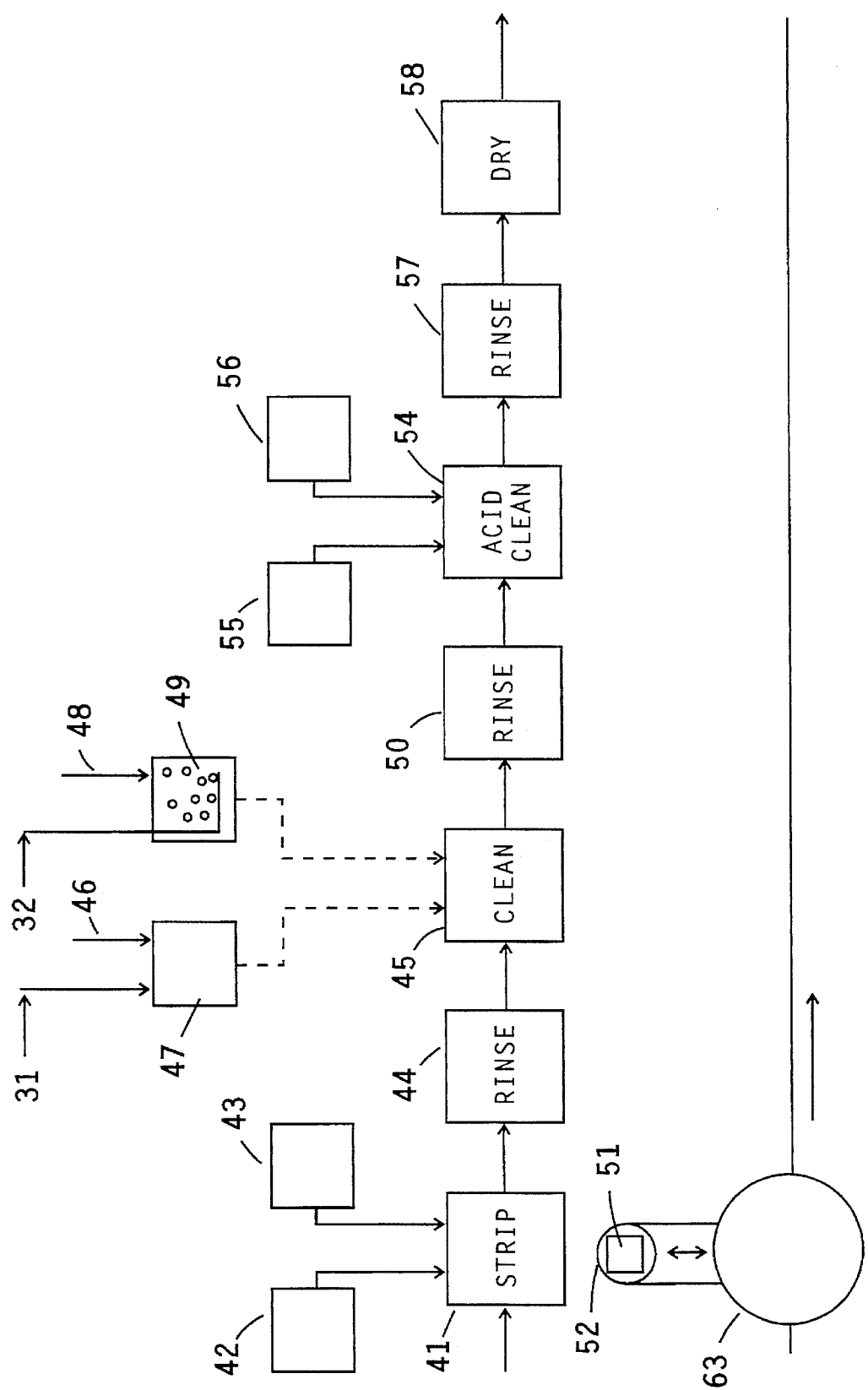
FIG. 2 is a block diagram of a semiconductor fabrication line in which the ammonia purification of FIG. 1 may be incorporated, thereby serving as one example of an implementation of the present invention.

A conventional cleaning line for semiconductor fabrication is depicted in FIG. 2. The first unit in the cleaning line is a resist stripping station 41 where aqueous hydrogen peroxide 42 and sulfuric acid 43 are combined and applied to the semiconductor surface to strip off the resist. This is succeeded by a rinse station 44 where deionized water is applied to rinse off the stripping solution. Immediately downstream of the rinse station 44 is a cleaning station 45 where an aqueous solution of ammonia and hydrogen peroxide are applied. This solution is supplied in one of two ways. In the first, aqueous ammonia 31 from the dissolving unit 29 shown in FIG. 1 is combined with aqueous hydrogen peroxide 46, and resulting the mixture 47 is directed to the cleaning station 45. In the second, pure gaseous ammonia 32 from the like-numbered line in FIG. 1 is bubbled into an aqueous hydrogen peroxide solution 48 to produce a similar mixture 49, which is likewise directed to the cleaning station 45. Once cleaned with the ammonia/hydrogen peroxide combination, the semiconductor passes to a second rinse station 50 where deionized water is applied to remove the cleaning solution. The next station is a further cleaning station 54 where aqueous solutions of hydrochloric acid 55 and hydrogen peroxide 56 are combined and applied to the semiconductor surface for further cleaning. This is followed by a final rinse station 57 where deionized water is applied to remove the HCl and $H_2O_2$, and finally a drying station 58. The wafer or wafer batch 61 will be held on a wafer support 52, and conveyed from one workstation to the next by a robot 63 or some other conventional means of achieving sequential treatment. The means of conveyance may be totally automated, partially automated or not automated at all. Note that purified HCl for the acid cleaning station 54 may be prepared and supplied on site in a manner similar to that of the ammonia purification system of FIG. 1.

The use of ammonia and hydrogen peroxide as a semiconductor cleaning medium at workstations such as the cleaning station 45 shown in FIG. 2 is well known throughout the industry. While the proportions vary, a nominal system would consist of deionized water, 29% ammonium hydroxide (weight basis) and 30% hydrogen peroxide (weight basis), combined in a volume ratio of 6:1:1. This cleaning agent is used to remove organic residues, and, in conjunction with ultrasonic agitation at frequencies of approximately 1 MHz, removes particles down to the submicron size range.

The ammonia purification system will be positioned in close proximity to the point of use of the ammonia in the production line. The ammonia can therefore be directly applied to the semiconductor substrate without packaging or transport and without storage other than a small in-line reservoir, and thus without contact with the potential sources of contamination normally encountered when chemicals are manufactured and prepared for use at locations external to the manufacturing facility. The distance between the point at which the ammonia leaves the purification system and its point of use on the production line will generally be less than about one foot (30 cm). This distance will be greater when the purification system is a central plant-wide system for piping to two or more use stations, in which case the distance will be about twenty feet (6.1 m) or less. Transfer can be achieved through an ultra-clean transfer line of a material which does not introduce contamination. In most applications, stainless steel or polymers such as high density polyethylene or fluorinated polymers can be used successfully.

Due to the proximity of the ammonia purification unit to the production line, the water used in the unit can be purified in accordance with semiconductor manufacturing standards. These standards are commonly used in the semiconductor industry and well known among those skilled in the art and experienced in the industry practices and standards. Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter; diatomaceous earth filtration; anion exchange to remove strongly ionized acids; mixed bed polishing, containing both cation and anion exchange resins, to remove further ions; sterilization, involving chlorination or ultraviolet light; and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances. Typical standards for the purity of the water resulting from these processes are a resistivity of at least about 15 megohm-era at 25° C. (typically 18 megohm-cm at 25° C.), less than about 25 ppb of electrolytes, a particulate content of less than about $150/cm^3$ and a particle size of less than 0.2 micron, a microorganism content of less than about $10/cm^3$, and total organic carbon of less than 100 ppb.

In the process and system of this invention, a high degree of control over the product concentration and hence the flow rates is achieved by precise monitoring and metering using known equipment and instrumentation. A convenient means of achieving this for ammonia is by vapor pressure measurement. Other methods will be readily apparent to those skilled in the art.

The foregoing is offered primarily for purposes of illustration. It will be readily apparent to those skilled in the art that further modifications, substitutions and variations of various kinds can be made in terms of the many system parameters discussed above without departing from the spirit and scope of the invention.

What is claimed is:

1. A system for the preparation of ultra-high purity ammonia, said system comprising:

(a) a reservoir of liquid ammonia with a vapor space above said liquid ammonia;

(b) means for drawing vapor containing ammonia gas from said vapor space;

(c) a filtration membrane removing particles greater than 0.005 micron from vapor thus drawn; and (d) an aqueous ammonia scrubber containing an aqueous solution of ammonia in deionized water, arranged to contact filtered vapor having passed through said filtration membrane with said aqueous solution, the vapor thus scrubbed being purified ammonia gas.

2. A system in accordance with claim 1, further comprising a distillation column arranged to distill vapor emerging from said scrubber.

3. A system for the manufacture of a high-precision electronic component, said system comprising:

(a) a production line containing a plurality of workstations successively arranged for treating a workpiece to be formed into said electronic component, one such workstation selected for application of ammonia to said workpiece;

(b) means for conveying said workpiece to said workstations in succession along said production line; and (c) a subunit adjoining said production line at said selected workstation to supply said ammonia in ultra-high purity form, said subunit comprising:

(i) a reservoir of liquid ammonia with a vapor space above said liquid ammonia;

(ii) means for drawing vapor containing ammonia gas from said vapor space;

(iii) a filtration membrane removing particles greater than 0.005 micron from vapor thus drawn; and (iv) a scrubber arranged to contact filtered vapor having passed through said filtration membrane with an aqueous solution of ammonia in deionized water, the vapor thus scrubbed being purified ammonia gas; and (d) means for applying the product of step (c) directly to a workpiece at said workstation;

said production line, said conveying means and said subunit all being free of contamination by semiconductor manufacturing standards defined as a resistivity of at least about 15 megohm-cm at 25° C., less than about 25 ppb of electrolytes, a particulate content of less than about 150/cm$^3$ and a particle size of less than 0.2 micron, a microorganism content of less than about 10/cm$^3$, and total organic carbon of less than 100 ppb.

4. A system in accordance with claim 3 in which said subunit further comprises a distillation column arranged to distill vapor emerging from said scrubber.

5. A system in accordance with claim 3 in which said subunit further comprises means for combining said purified ammonia gas with purified water to form an aqueous ammonia solution.

6. A system in accordance with claim 3 further comprising an ammonia outlet on said scrubber, said ammonia outlet positioned within approximately 30 cm of said means for applying the product of step (c) directly to said workpiece.

7. A system in accordance with claim 3 in which said subunit is sized to produce said purified ammonia gas at a rate of from about 200 cc/h to about 2 L/h.

8. A system in accordance with claim 3 in which components (ii), (iii) and (iv) of said subunit are arranged for continuous or semi-continuous flow.

9. A method for supplying a high-purity ammonia reagent to a workstation in a production line for the manufacture of a high-precision electronic component, said method comprising:

(a) drawing ammonia gas from a vapor space above liquid ammonia in an ammonia-containing reservoir;

(b) passing said ammonia gas through a filtration membrane removing particles greater than 0.005 micron therefrom;

(c) passing said ammonia gas thus filtered through a scrubber wherein said ammonia gas is contacted with an aqueous solution of ammonia in deionized water; and (d) recovering said ammonia gas emerging from said scrubber and directing said ammonia gas to said workstation.

10. A method in accordance with claim 9 further comprising dissolving said ammonia gas emerging from said scrubber in purified water prior to directing said ammonia gas to said workstation.

11. A method in accordance with claim 9 further comprising passing said ammonia gas through a distillation column for further purification prior to directing said ammonia gas to said workstation.

12. A method in accordance with claim 9 further comprising:

(c') passing said ammonia gas from said scrubber through a distillation column for further purification, and dissolving said ammonia gas emerging from said distillation column in purified water prior to directing said ammonia gas to said workstation.

13. A method in accordance with claim 9 in which step (c) is conducted at a temperature ranging from about 10° C. to about 50° C.

14. A method in accordance with claim 9 in which step (c) is conducted at a temperature ranging from about 15° C. to about 35° C.

15. A method in accordance with claim 12 in which steps (c) and (c') are conducted at a temperature ranging from about 15° C. to about 35° C.

16. A method in accordance with claim 9 in which step (c) is conducted at a temperature ranging from about 15° C. to about 35° C. and at a pressure of from about atmospheric pressure to about 30 psi above atmospheric pressure.

17. A method in accordance with claim 12 in which steps (c) and (c') are conducted at a temperature ranging from about 15° C. to about 35° C. and at a pressure of from about atmospheric pressure to about 30 psi above atmospheric pressure.

18. A method in accordance with claim 9 in which said scrubber is positioned within approximately 30 cm of said workstation.

19. A method in accordance with claim 12 in which said distillation column is positioned within approximately 30 cm of said workstation.

* * * * *